(12) United States Patent
Satoh et al.

(10) Patent No.: US 7,239,217 B2
(45) Date of Patent: Jul. 3, 2007

(54) ANTENNA DUPLEXER

(75) Inventors: Yuki Satoh, Osaka (JP); Kazushi Nishida, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 109 days.

(21) Appl. No.: 11/078,107

(22) Filed: Mar. 11, 2005

(65) Prior Publication Data
US 2005/0206478 A1    Sep. 22, 2005

(30) Foreign Application Priority Data
Mar. 16, 2004   (JP)   .............................. 2004-074258

(51) Int. Cl.
*H03H 9/72*   (2006.01)
(52) U.S. Cl. ........................... 333/133; 455/78; 455/83
(58) Field of Classification Search ................. 333/133
See application file for complete search history.

(56) References Cited

U.S. PATENT DOCUMENTS

| | | | | |
|---|---|---|---|---|
| 5,386,203 | A * | 1/1995 | Ishihara | 333/129 |
| 6,380,827 | B1 * | 4/2002 | Noguchi | 333/193 |
| 6,501,344 | B2 * | 12/2002 | Ikata et al. | 333/133 |
| 6,759,924 | B2 * | 7/2004 | Sakuragawa et al. | 333/133 |
| 6,911,708 | B2 * | 6/2005 | Park | 257/416 |
| 6,982,612 | B2 * | 1/2006 | Sakano | 333/133 |
| 6,995,630 | B2 * | 2/2006 | Satoh et al. | 333/133 |
| 2002/0186097 | A1 * | 12/2002 | Sakuragawa et al. | 333/133 |

FOREIGN PATENT DOCUMENTS

| | | | |
|---|---|---|---|
| EP | 0 446 050 A2 | * | 9/1991 |
| JP | 2000-349586 | | 12/2000 |
| JP | 2003-318701 | * | 11/2003 |
| JP | 2003-347963 | * | 12/2003 |
| JP | 2004-304506 | * | 10/2004 |

* cited by examiner

*Primary Examiner*—Barbara Summons
(74) *Attorney, Agent, or Firm*—RatnerPrestia

(57) ABSTRACT

The disclosed is a downsized and power saving antenna duplexer. The antenna duplexer includes: diplexer; first surface acoustic wave filter to transmit/receive low channel frequency band signals; first phase shift circuit to match the transmission phase with the reception phase of first surface acoustic wave filter; second surface acoustic wave filter to transmit/receive high channel frequency band signals; second phase shift circuit to match the transmission phase with the reception phase of second surface acoustic wave filter. Diplexer, first phase shift circuit and second phase shift circuit are formed in a monolithic structure in package that includes surface acoustic wave filters. The configuration can provide the antenna duplexer with a compact size, a lower current consumption and a highly efficient performance.

3 Claims, 5 Drawing Sheets

ANTENNA DUPLEXER

TECHNICAL FIELD

The present invention relates to an antenna duplexer, particularly used in cell-phones or the like, for transmitting and receiving a plurality of frequency band signals.

BACKGROUND ART

FIG. 10 shows an example of conventional antenna duplexer schematically. The example employs a system having a plurality of antenna duplexers 1 and 2 housed in one package 5, selecting respective antenna duplexers by switch 3. In FIG. 10, switch 3 connects to antenna 4. Antenna duplexer 1 includes transmission terminal Tx1 and reception terminal Rx1 respectively. Antenna duplexer 2 includes similar terminals Tx2 and Rx2 respectively. Another known system (not shown) is to select one of antenna duplexers provided separately using a switching circuit.

A conventional art related to the present invention is disclosed for instance in Japanese Patent Laid-Open Application No. 2000-349586.

In a conventional art, generally, a large overall size of the antenna duplexer must be accepted since a switching circuit and respective antenna duplexers are provided separately. A large current consumption must also be accepted due to the switching circuit provided additionally. Even if the current consumption is restrained to a low level, the problem is that signal distortions such as harmonic components generated in signal transmission or intermodulation generated in signal reception are likely to occur due to a non-linearity of the switching circuit. Additionally, switching circuits or surface acoustic wave (SAW) filters used in the antenna duplexer must accept problems of deterioration in electrical characteristics of the antenna duplexer itself or peripheral circuits due to undesired surge pulses intruding through the antenna terminal. Particularly, switching circuits near the antenna or adjacent circuits are likely to be influenced by the surge pulses, causing in some case the circuits to deteriorate in electrical or physical characteristics.

The present invention can provide an antenna duplexer with a high performance and a high reliability while having a compact size.

SUMMARY OF THE INVENTION

An antenna duplexer capable of transmitting and receiving (defined herein as "transmitting/receiving") a plurality of frequency band signals simultaneously. The antenna duplexer is provided with a diplexer to combine a plurality of different frequency band signals by transmitting/receiving through a terminal connected to an antenna. The antenna duplexer is additionally provided with a first surface acoustic wave (SAW) filter to transmit/receive low frequency band signals through the diplexer and a first phase shift circuit to match the transmission phase with reception phase of the first SAW filter. A duplexer is composed of the first SAW filter and the first phase shift circuit to match the transmission phase with the reception phase of the first SAW filter.

Additionally, the antenna duplexer of the present invention is provided with a second SAW filter to transmit/receive high frequency band signals to the diplexer and a second phase shift circuit to match the transmission phase with the reception phase of the second SAW filter. The second SAW filter and the second phase shift circuit to match the transmission phase with the reception phase of the second SAW filter all together make up another duplexer.

Furthermore, the diplexers, the first and second phase shift circuits, and the first and second SAW filters are housed in one package, forming the antenna duplexer.

The configuration enables to form the antenna duplexer with a downsized monolithic structure and to consume lesser electric power.

DETAILED DESCRIPTION

Exemplary Embodiment 1

Exemplary embodiment 1 is described with reference to drawings.

Figure 1:
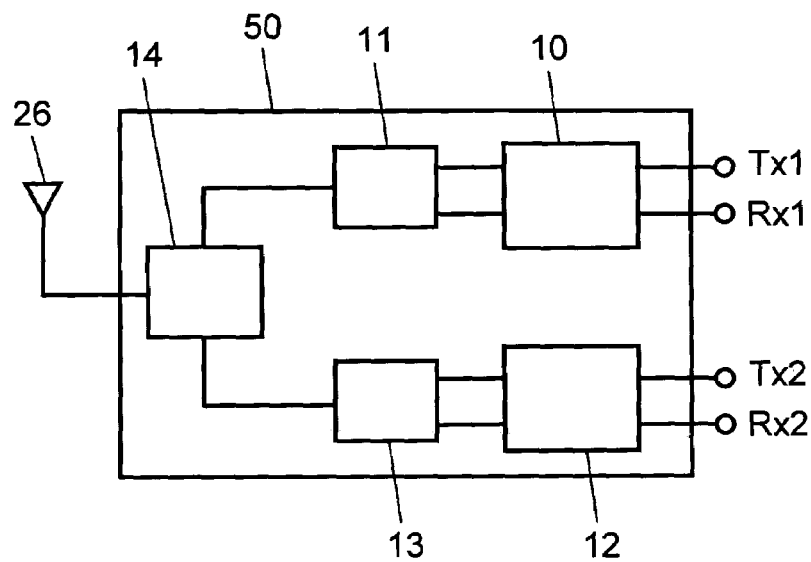
FIG. 1 illustrates a circuit block diagram of an antenna duplexer used in exemplary embodiment 1 of the present invention.

FIG. 1 illustrates a circuit block diagram of an antenna duplexer used in exemplary embodiment 1 of the present invention. Antenna duplexer 50 is provided with first SAW filter 10. First SAW filter 10 includes a transmission filter (not shown) to pass frequencies ranging 824 to 849 MHz and a reception filter (not shown) to pass frequencies ranging 869 to 894 MHz. First phase shift circuit 11 is provided for impedance matching by phase shifting. Additionally, first SAW filter 10 and first phase shift circuit 11 form a duplexer for low channel frequency band to be used for instance in CDMA (Code Division Multiple Access) system of 800 MHz band.

Here, the diplexer differs from the duplexer in that: the diplexer locating at the head from an antenna is a filter device to select a double-frequency band or so called a dual band, but the duplexer locating at the way to the antenna plays a role of transmission/reception filter to separate signals into transmission signals and reception signals.

Moreover, antenna duplexer 50 of the present invention is provided with a second surface acoustic wave (SAW) filter 12. Second SAW filter 12 includes a transmission filter (not shown) to pass so called a high channel 1850 to 1910 MHz band and a reception filter (not shown) to pass 1930 to 1990 MHz band.

Second phase shift circuit 13 is provided for impedance matching by phase shifting the reception filter. Second SAW filter 12 and second phase shift circuit 13 form a duplexer for high channel frequency used for instance in PCS (Personal Communication System) CDMA system of 1.9 GHz band in North America. Additionally, diplexer 14 is provided with a low-pass filter (LPF) to pass 800 MHz band and a high-pass filter to pass 1.9 GHz band. Connecting these two filters provides an antenna duplexer capable of transmitting and receiving in both 800 MHz band and 1.9 GHz band, which is capable for a so-called dual mode operation.

Figure 2:
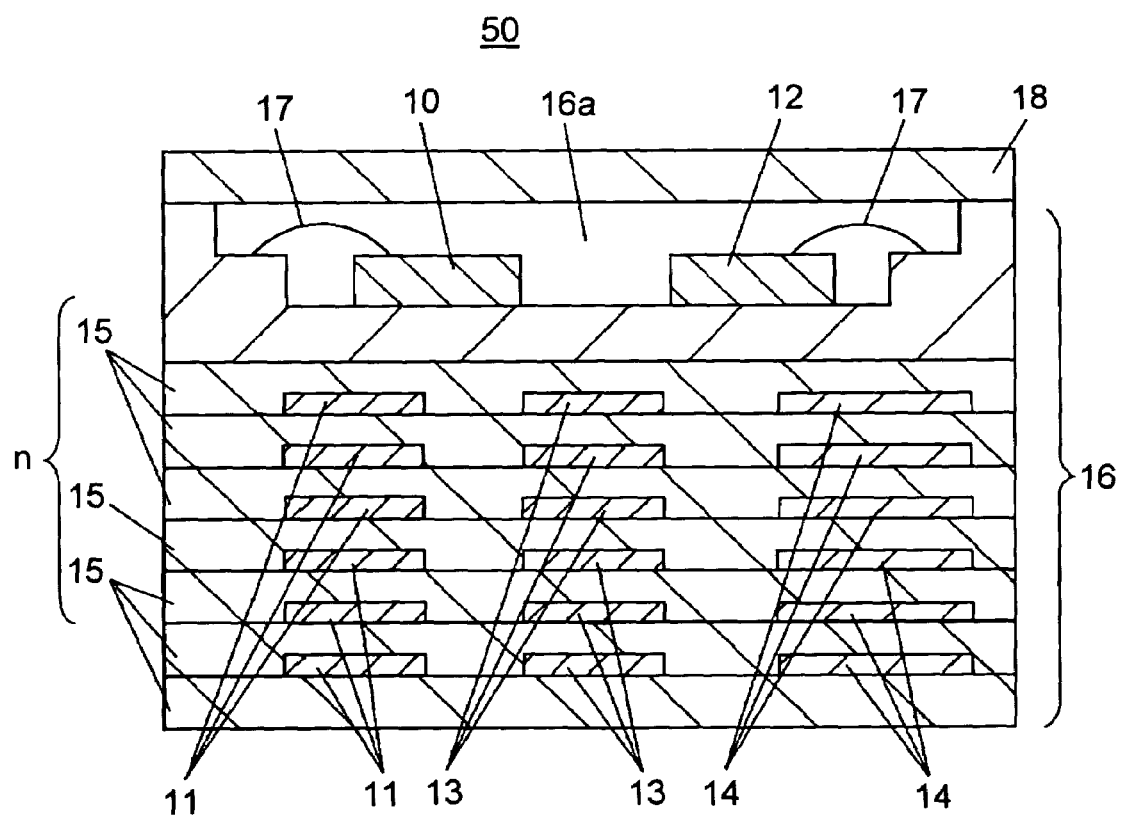
FIG. 2 illustrates a cross-sectional view of the antenna duplexer.

FIG. 2 illustrates a cross-sectional view of the antenna duplexer used in exemplary embodiment 1 of the present invention. Layers of low temperature co-fired ceramic (LTCC) 15 are laminated with first phase shift circuit 11, second phase shift circuit 13 and diplexer 14 printed using silver or copper and sandwiched between the layers. Cavity 16a is further formed on the laminate, forming package 16. First surface acoustic wave (SAW) filter 10, second SAW filter 12 are secured in cavity 16a of package 16 by die bonding. Terminal pads (not shown) provided on first SAW filter 10 and second SAW filter 12 respectively are connected with terminals (not shown) provided on internal periphery of package 16 by wires 17. Furthermore package 16 is hermetically sealed by lid 18.

Since package is formed from LTCC 15, terminal patterns can be printed easily on LTCC 15 as well as its upper and bottom side LTCCs 15 by using materials with a high electric conductivity such as silver or copper. This can provide first phase shift circuit 11, second phase shift circuit 13 and diplexer 14 with low electric losses. Number of LTCC 15 can select 7 to 8 layers.

Figure 3:
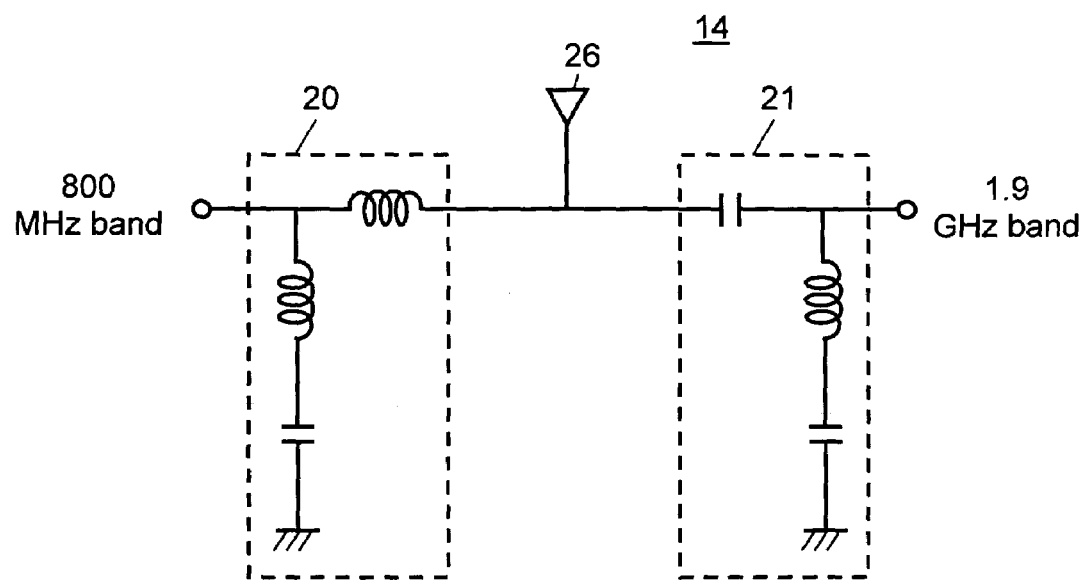
FIG. 3 illustrates a circuit diagram of a diplexer used in the antenna duplexer.

Next, FIG. 3 illustrates a partial circuit diagram of diplexer 14 used for antenna duplexer 50. Diplexer 14 includes low-pass filter 20 to pass a comparatively low channel of 800 MHz band and high-pass filter 21 to pass a comparatively high channel of 1.9 GHz band connected each other. Antenna terminal 26 connects to these two filters. Compared with dielectric filter, generally, SAW filter used in antenna duplexer 50 makes it difficult to improve a resistance level to static electricity.

Figure 4:
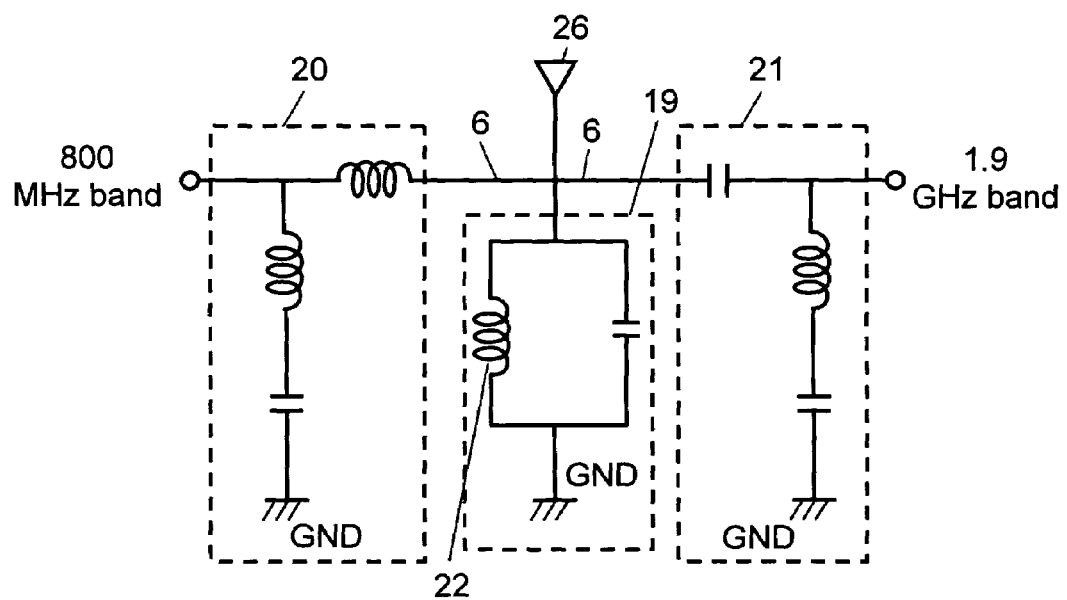
FIG. 4 illustrates a circuit diagram of a surge protector used in the antenna duplexer.

FIG. 4 illustrates a circuit diagram when a surge protector 19 is provided between antenna terminal 26 and ground (GND) to improve the resistance level to the static electricity. The configuration can improve the resistance level to the static electricity. Surge protector 19 shown in FIG. 14 is basically a circuit to add inductor 22 between signal line 6 transmitting high frequency signals and GND. By introducing surge protector 19, anti-surge characteristics against undesired static electricity or noises (hereafter referred to surge pulses) intruding through antenna terminal 26 can be improved.

The present invention depends upon a finding that energy spectra of so-called surge pulses intruding from antenna terminal 26 or antenna duplexer shows a concentration near to DC signals. That is, an impedance value of inductor 22 decreases near DC causing most surge energies to flow to GND, thereby resulting in little influence on circuitry such as the antenna duplexer or the like.

Additionally, mounting surge protector 19 along with first phase shift circuit 11, second phase shift circuit 13 and diplexer 14 all together in package 16 can achieve a cost reduction and downsizing of entire antenna duplexer 50, and can improve anti-surge pulse characteristics.

Figure 5:
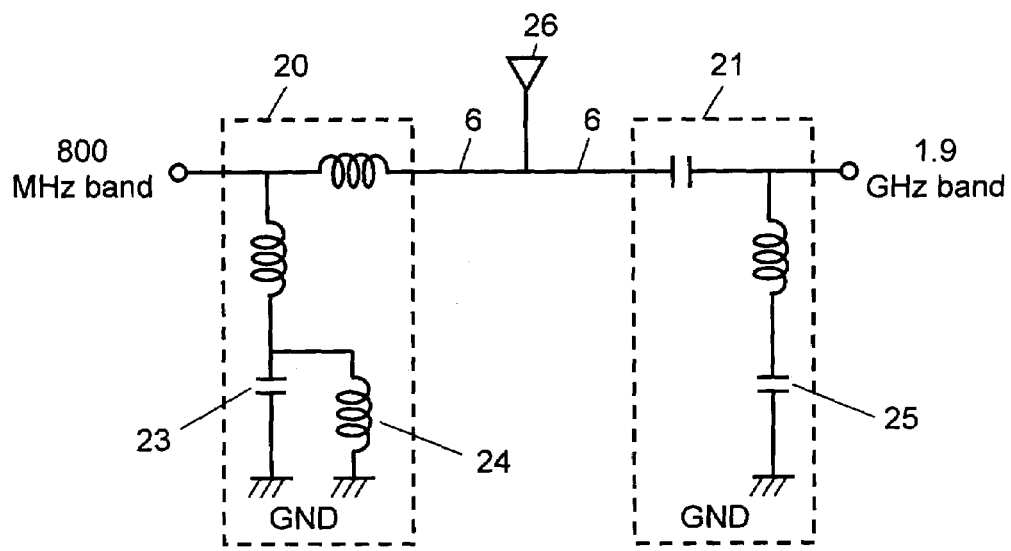
FIG. 5 illustrates a circuit diagram of a diplexer used in the antenna duplexer.

Next, FIG. 5 illustrates the main part of another diplexer 14 of the present invention that can improve the anti-surge pulse characteristics. Inductor 24 is provided in parallel with capacitor 23 that forms low-pass filter 20 of diplexer 14. Capacitor 25 is added on the side of high-pass filter 21. The configuration can attenuate comparatively low frequency surge pulses intruding from antenna terminal 26.

However, low frequency surge pulses intruding from antenna terminal 26 does not attenuate in low-pass filter 20 but passes directly to SAW filter, causing diplexer 14 at risk of deterioration in electrical or physical characteristics.

Therefore, the present invention allows improving the anti-surge pulse characteristics by introducing inductor 24 on the side of low-pass filter 20 to bypass undesired surge pulses intruding from antenna terminal 26.

Low-pass filter 20 including inductor 24 and high-pass filter 21 can be formed incorporated together with first SAW filter 10, first phase shift circuit 11 and diplexer 14 shown in FIG. 2 in one package 16. The structure can realize the antenna duplexer with a compact size and a reduced production cost.

Figure 6:
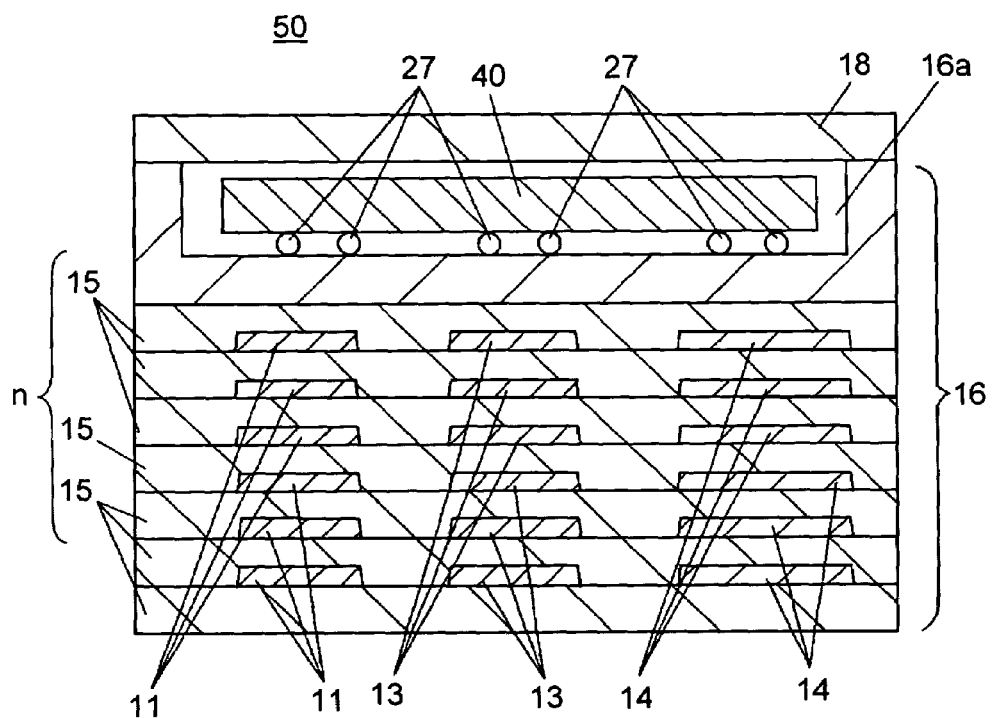
FIG. 6 illustrates a cross-sectional view of another antenna duplexer used in exemplary embodiment 1 of the present invention.

FIG. 6 shows a cross-sectional view of another antenna duplexer used in exemplary embodiment 1. Similar to shown in FIG. 2, antenna duplexer 50 shown in FIG. 6 is provided with first phase shift circuit 11, second phase shift circuit 13 and diplexer 14. Similarly, the antenna duplexer is also provided with LTCC 15, cavity 16a and package 16. Both antenna duplexers have largely the similar structure.

Antenna duplexer 50 shown in FIG. 6 differs from that shown in FIG. 2 in following points: antenna duplexer 50 shown in FIG. 6 is provided with one SAW filter 40 only, while antenna duplexer 50 shown in FIG. 2 with two SAW filters of first SAW filter 10 and second SAW filter 12. That is, SAW filter 40 is thought to include parts corresponding to first SAW filter 10 and second SAW filter 12 built-in one chip.

Additionally, the antenna duplexer is featured that SAW filter 40 adopts bumps 27 instead of wires 17. The structure can reduce the height of antenna duplexer since a curve of wire 17 and a space to lid from wire 17 do not present anymore, enabling to realize a low profiling for entire antenna duplexer. There is no relation between a number of SAW filter mounted in package 16 and arrangements of bumps. Therefore, if SAW filter 40 is formed in one integration, wires 17 may be adopted instead of using bumps 27 as shown in FIG. 2.

Comparing antenna duplexer 50 shown in FIG. 2 with antenna duplexer 50 shown in FIG. 6, antenna duplexer 50 shown in FIG. 6 can increase design freedom because SAW filter 40 can be enlarged, and that number of elements made into first phase shift circuit 11 or second phase shift circuit 13 can be increased, if both packages 16 are the same in size.

Also for package 16 shown in FIG. 6, first phase shift circuit 11, second phase shift circuit 13 and diplexer 14 should preferably be formed printed using silver or copper and sandwiched between layers of laminated LTCC 15. This can provide the electric elements with low electric losses.

Exemplary Embodiment 2

Next, exemplary embodiment 2 is described with reference to FIG. 7.

Exemplary embodiment 2 differs from exemplary embodiment 1 in following points: diplexer 14 selects double-frequency band signals or so called dual band signals that includes low channel or low frequency 800 MHz band signals and high channel or high frequency 1.9 GHz band signals in exemplary embodiment 1, on the contrary, a phase shift circuit performs a phase matching of duplexers for different frequency bands in exemplary embodiment 2.

Figure 7:
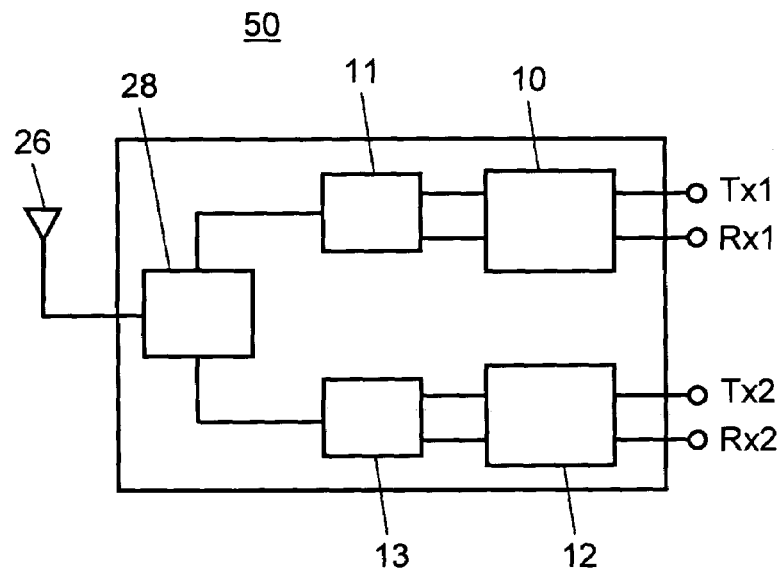
FIG. 7 illustrates a circuit block diagram of an antenna duplexer used in exemplary embodiment 2 of the present invention.

FIG. 7 shows antenna duplexer 50. Antenna duplexer 50 includes a low channel of 800 MHz band duplexer including first SAW filter 10 and first phase shift circuit 11. Second SAW filter 12 together with second phase shift circuit 13 forms a 1.9 GHz high frequency band duplexer. Here, if enough out-of-pass band attenuation amount in respective 800 MHz band and 1.9 GHz band are obtained, diplexer 14 needs not to select signals as attenuation characteristics like in exemplary embodiment 1 but have to perform a phase matching.

Therefore, antenna duplexer 50 capable of transmitting and receiving both in 800 MHz band and 1.9 GHz band is accomplished by connecting these elements via third phase shift circuit 28. Phase shift circuit 28 can be composed of for instance a triplate transmission line whose upper and lower portions are sandwiched by grounded terminals. In this case, the configuration of phase shift circuit sandwiched by GND can provide the antenna duplexer with a more stable and higher performance, since electromagnetic interference from surrounding circuits or parts are protected. Antenna terminal 26 connects to phase shift circuit 28. Such circuit configuration can provide phase shift circuit 28 with reduced electric losses.

In FIG. 7, first SAW filter 10 has transmission terminal Tx1 and reception terminal Rx1 respectively. Second SAW filter 12 has similar terminals Tx2 and Rx2 respectively.

Figure 8:
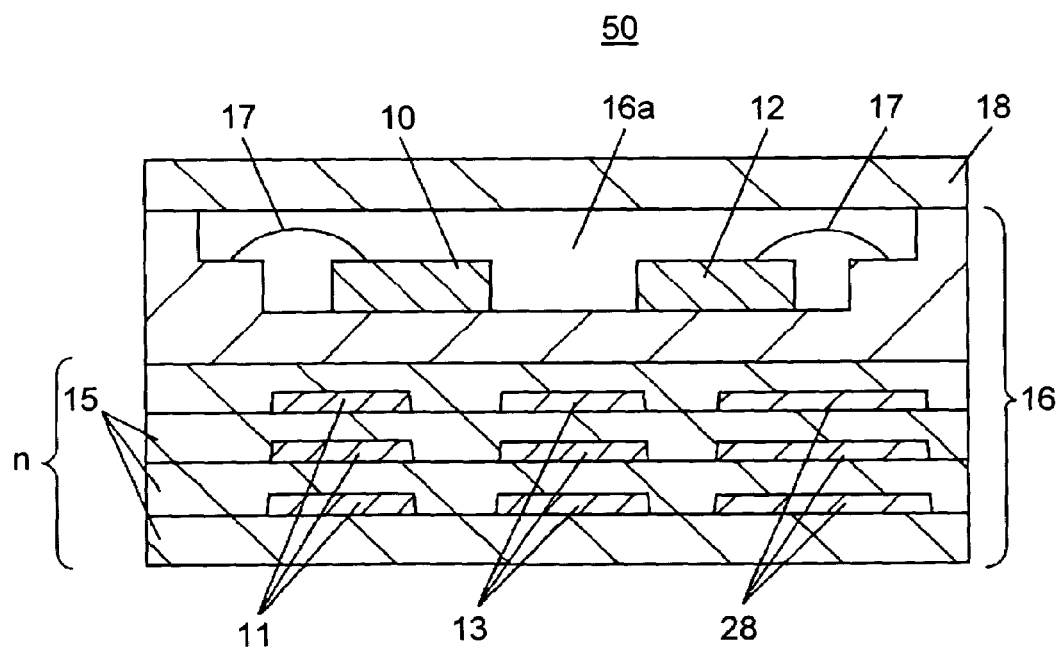
FIG. 8 illustrates a cross-sectional view of the antenna duplexer used in exemplary embodiment 2 of the present invention.

FIG. 8 shows a cross-sectional view of the antenna duplexer used in exemplary embodiment 2. Layers of LTCC 15 are laminated, and first phase shift circuit 11, second phase shift circuit 13 and third phase shift circuit 28 are formed printed using silver, copper or the like and sandwiched between the layers.

Cavity 16a is further formed on the laminate to form package 16. Thus antenna multiplexer is produced by a method similar to exemplary embodiment 1.

Antenna duplexer 50 of exemplary embodiment 1 needs 6 to 7 layers of LTCC 15. On the contrary, antenna duplexer 50 of exemplary embodiment 2 can reduce the layer number to 3 to 4, since whole elements are composed of phase shift circuit 28. The configuration can realize a low-profile form (1.0 to 1.5 mm) of package 16 as well as a reduced price.

Exemplary Embodiment 3

Next, exemplary embodiment 3 is described with reference to FIG. 9.

Exemplary embodiment 3 differs from exemplary embodiment 1 in following points: first SAW filter 10, first phase shift circuit 11, second SAW filter 12, second phase shift circuit 13 and diplexer 14 are described formed in a monolithic structure in exemplary embodiment 1; on the contrary, only first SAW filter 10, first phase shift circuit 11 and diplexer 14 are formed in a monolithic structure in exemplary embodiment 3.

Figure 9:
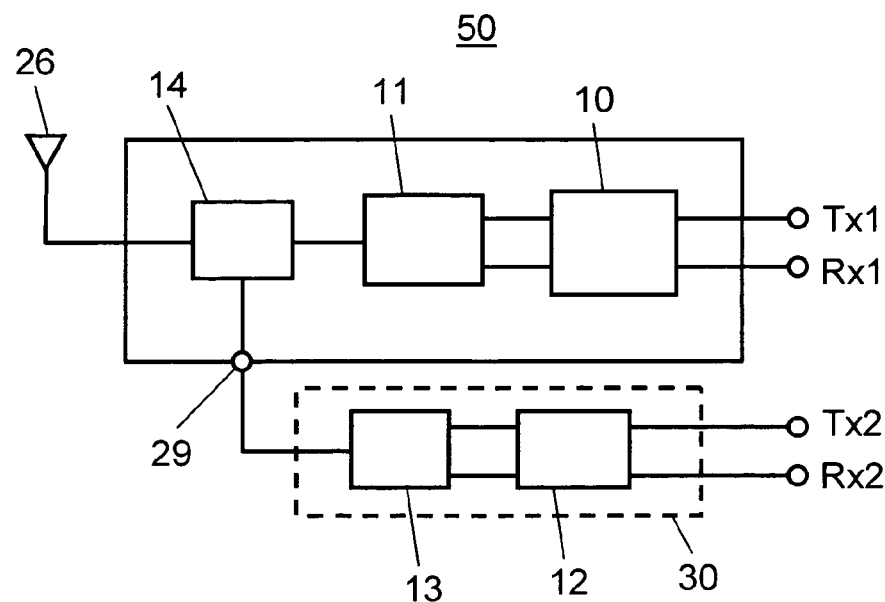
FIG. 9 illustrates a circuit block diagram of an antenna duplexer used in exemplary embodiment 3 of the present invention.
Figure 10:
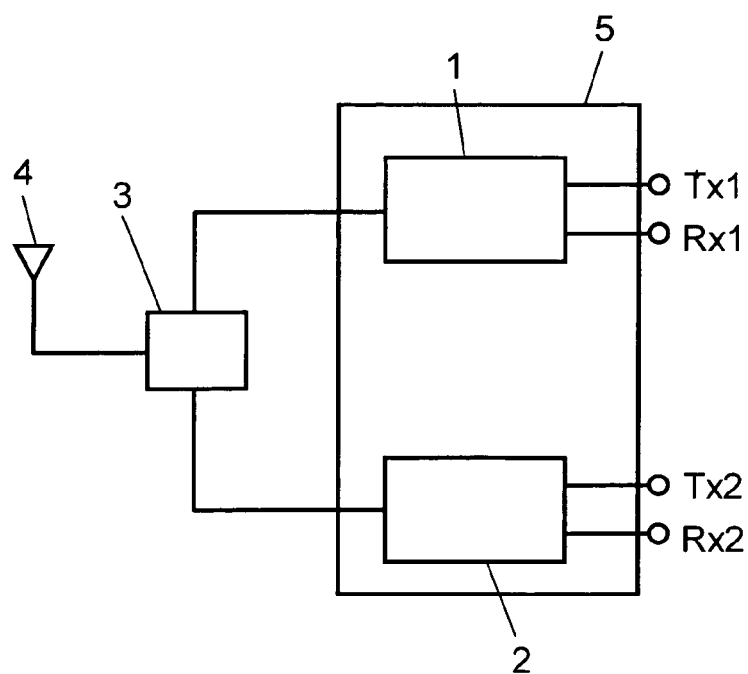
FIG. 10 illustrates a circuit block diagram of a conventional antenna duplexer.

FIG. 9 shows a duplexer comprising first SAW filter 10 and first phase shift circuit 11 for a low channel of 800 MHz band signals. Phase shift circuit 11 connects to diplexer 14. 1.9 GHz terminal of diplexer 14 connects to external terminal 29. External terminal 29 of antenna duplexer 50 connects to duplexer 30 to be used for 1.9 GHz band. This can form antenna duplexer for both 800 MHz band and 1.9 GHz band. Duplexer 30 includes second SAW filter 12 and second phase shift circuit 13.

In FIG. 9, first SAW filter 10 has transmission terminal Tx1 and reception terminal Rx1 respectively. Second SAW filter 12 has Tx2 and Rx2 respectively. Diplexer 14 connects to antenna terminal 26.

Such circuit configuration is not a kind of monolithic structure antenna duplexer but combining duplexers for 800 MHz band and 1.9 GHz band that have been prepared previously separately to form one antenna duplexer. Therefore, even in a case of for instance the supply of accepted high channel duplexers for 1.9 GHz band is short due to an unsatisfactory yield ratio while accepted low channel duplexers for 800 MHz band are supplied sufficiently, combining accepted respective duplexers can produce a complete antenna duplexer 50.

The reverse can be a possible case. That is a case when the supply of accepted low channel duplexer 30 for 800 MHz band is short due to an unsatisfactory yield ratio while accepted high channel duplexers for 1.9 GHz band are supplied sufficiently. In this case, second SAW filter 12 and second phase shift circuit 13 can form the high channel duplexer for 1.9 GHz band. A configuration may be that the duplexer connects to diplexer 14 and subsequently a 800 MHz band terminal of diplexer 14 connects to external terminal 29. Namely, either of for 800 MHz band and for 1.9 GHz band can be mounted on duplexer 30.

Antenna duplexer 50 described in exemplary embodiment 1 includes a low channel duplexer for 800 MHz band and a high channel duplexer for 1.9 GHz band in a monolithic structure. Therefore, the entire antenna duplexer must be rejected if either of the duplexers cannot satisfy required values. From this point of view, however, antenna duplexer 50 described in exemplary embodiment 3 can use individual duplexers efficiently.

In FIG. 9, package 16 can include second phase shift circuit 13 internally. That is, these can be formed to a monolithic structure. Second SAW filter 12, that has been left alone in this case, can be formed in a package made from HTCC, contributing to a cost reduction.

INDUSTRIAL APPLICABILITY

The antenna duplexer disclosed is a system used for a plurality of frequency band signals with a compact size, and can perform well with a high reliability. The system is useful for mobile communication equipment such as cell-phone or the like, having a high industrial applicability.

The invention claimed is:

1. An antenna duplexer for transmitting and receiving a plurality of different frequency band signals simultaneously comprising:
   a diplexer to combine a plurality of different frequency band signals for transmitting and receiving through a terminal connected to an antenna terminal;
   a first surface acoustic wave filter to transmit and receive low channel frequency band signals through the diplexer;
   a first phase shift circuit to match a transmission phase with a reception phase of the first surface acoustic wave filter;
   a second surface acoustic wave filter to transmit and receive high channel frequency band signals through the diplexer; and
   a second phase shift circuit to match a transmission phase with a reception phase of the second surface acoustic wave filter;
   wherein the diplexer, the first phase shift circuit and the second phase shift circuit are formed in a package which includes the first surface acoustic wave filter and the second surface acoustic wave filter, wherein the first surface acoustic wave filter and the second surface acoustic wave filter are formed on one chip and are connected to the package using bumps.

2. An antenna duplexer for transmitting and receiving a plurality of different frequency band signals simultaneously comprising:

a first surface acoustic wave filter to transmit and receive low channel frequency band signals;

a first phase shift circuit to match a transmission phase with a reception phase of the first surface acoustic wave filter;

a second surface acoustic wave filter to transmit and receive high channel frequency band signals;

a second phase shift circuit to match a transmission phase with a reception phase of the second surface acoustic wave filter; and a third phase shift circuit to match the first surface acoustic wave filter to the second surface acoustic wave filter;

wherein the first phase shift circuit, the second phase shift circuit and the third phase shift circuit are formed in a package which includes the first surface acoustic wave filter and the second surface acoustic wave filter, and the third phase shift circuit is composed of a triplate transmission line whose upper and lower sides are sandwiched by grounded electrodes.

3. An antenna duplexer for transmitting and receiving a plurality of different frequency band signals simultaneously comprising:

a diplexer to combine a plurality of different frequency band signals for transmitting and receiving through a terminal connected to an antenna terminal;

a surface acoustic wave filter to transmit and receive high channel frequency band signals through the diplexer;

a phase shift circuit to match a transmission phase with a reception phase of the surface acoustic wave filter; and an external terminal to input and output low channel frequency band signals through the diplexer;

wherein the diplexer and the phase shift circuit are formed in a package that includes the surface acoustic wave filter.

* * * * *